US00RE45180E

(19) United States
(12) Reissued Patent
Chen et al.

(10) Patent Number: US RE45,180 E
(45) Date of Reissued Patent: Oct. 7, 2014

(54) STRUCTURE FOR A MULTIPLE-GATE FET DEVICE AND A METHOD FOR ITS FABRICATION

(75) Inventors: Hung-Wei Chen, Hsin-Chu (TW); Tang-Xuan Zhong, Kaohsiung (TW); Sheng-Da Liu, Hsin-Chu (TW); Chang-Yun Chang, Taipei (TW); Ping-Kun Wu, Hsin-Chu (TW); Chao-Hsiung Wang, Hsin-Chu (TW); Fu-Liang Yang, Hsin-Chu (TW)

(73) Assignee: Taiwan Semiconductor Manufacturing Company, Ltd., Hsin-Chu (TW)

(21) Appl. No.: 12/792,373

(22) Filed: Jun. 2, 2010

Related U.S. Patent Documents

Reissue of:
(64) Patent No.: 7,381,649
Issued: Jun. 3, 2008
Appl. No.: 11/192,494
Filed: Jul. 29, 2005

(51) Int. Cl.

| | |
|---|---|
| ***H01L 21/311*** | (2006.01) |
| ***H01L 21/00*** | (2006.01) |
| ***H01L 21/84*** | (2006.01) |
| ***H01L 21/8238*** | (2006.01) |
| ***H01L 21/336*** | (2006.01) |
| *H01L 27/085* | (2006.01) |
| *H01L 29/06* | (2006.01) |
| *H01L 29/04* | (2006.01) |

(52) U.S. Cl.
USPC ..... 438/700; 438/701; 438/157; 438/221; 438/283; 257/255; 257/622; 257/623; 257/627; 257/628; 257/E29.264

(58) Field of Classification Search
None
See application file for complete search history.

(56) References Cited

U.S. PATENT DOCUMENTS

| | | | | |
|---|---|---|---|---|
| 6,225,187 | B1 * | 5/2001 | Huang et al. | 438/424 |
| 6,642,090 | B1 | 11/2003 | Fried et al. | |
| 6,706,571 | B1 | 3/2004 | Yu et al. | |
| 6,858,478 | B2 | 2/2005 | Chau et al. | |
| 6,933,215 | B2 * | 8/2005 | Bromberger et al. | 438/527 |
| 7,190,050 | B2 | 3/2007 | King et al. | |
| 7,247,887 | B2 | 7/2007 | King et al. | |
| 7,250,346 | B2 * | 7/2007 | Chun et al. | 438/283 |
| 7,265,008 | B2 | 9/2007 | King et al. | |
| 7,508,031 | B2 | 3/2009 | Liu et al. | |
| 7,528,465 | B2 | 5/2009 | King et al. | |
| 7,605,449 | B2 | 10/2009 | Liu et al. | |

(Continued)

OTHER PUBLICATIONS

Park, T., et al., "Fabrication of Body-Tied FinFETs (Omega MOSFETs) Using Bulk Si Wafers", VLSI Technology, 2003 Symposium, Jun. 10-12, 2003, pp. 135-136.

(Continued)

*Primary Examiner* — Michael Jung
(74) *Attorney, Agent, or Firm* — Slater and Matsil, L.L.P.

(57) ABSTRACT

A method for forming a semiconductor device and a device made using the method are provided. In one example, the method includes forming a hard mask layer on a semiconductor substrate and patterning the hard mask layer to form multiple openings. The substrate is etched through the openings to form forming a plurality of trenches separating multiple semiconductor mesas. The trenches are partially filled with a dielectric material. The hard mask layer is removed and multiple-gate features are formed, with each multiple-gate feature being in contact with a top surface and sidewalls of at least one of the semiconductor mesas.

18 Claims, 14 Drawing Sheets

(56) References Cited

U.S. PATENT DOCUMENTS

| | | | | |
|---|---|---|---|---|
| 2002/0132422 | A1* | 9/2002 | Ranade et al. | 438/243 |
| 2003/0207579 | A1* | 11/2003 | Rattner et al. | 438/700 |
| 2004/0038540 | A1* | 2/2004 | Li et al. | 438/700 |
| 2004/0142562 | A1* | 7/2004 | Chen et al. | 438/689 |
| 2005/0035391 | A1 | 2/2005 | Lee et al. | |
| 2005/0130433 | A1* | 6/2005 | Dong et al. | 438/701 |
| 2005/0148152 | A1* | 7/2005 | Lee et al. | 438/424 |
| 2005/0153490 | A1 | 7/2005 | Yoon et al. | |
| 2005/0224800 | A1* | 10/2005 | Lindert et al. | 257/66 |
| 2005/0239254 | A1* | 10/2005 | Chi et al. | 438/270 |
| 2006/0166504 | A1* | 7/2006 | Yang | 438/701 |
| 2006/0246730 | A1* | 11/2006 | Kim et al. | 438/700 |
| 2007/0015368 | A1* | 1/2007 | Jhang | 438/700 |
| 2007/0120156 | A1 | 5/2007 | Liu et al. | |
| 2007/0122953 | A1 | 5/2007 | Liu et al. | |
| 2007/0122954 | A1 | 5/2007 | Liu et al. | |
| 2007/0128782 | A1 | 6/2007 | Liu et al. | |
| 2007/0132053 | A1 | 6/2007 | King et al. | |
| 2008/0290470 | A1 | 11/2008 | King et al. | |
| 2008/0296632 | A1 | 12/2008 | Moroz et al. | |
| 2009/0181477 | A1 | 7/2009 | King et al. | |

OTHER PUBLICATIONS

Park, T., et al., "Static Noise Margin of the Full DG-CMOS SRAM Cell Using Bulk FinFETs (Omega MOSFETs)", Electron Devices Meeting, IEEE International, Dec. 8-10, 2003, pp. 2.2.1-2.2.4.

* cited by examiner

STRUCTURE FOR A MULTIPLE-GATE FET DEVICE AND A METHOD FOR ITS FABRICATION

Matter enclosed in heavy brackets [ ] appears in the original patent but forms no part of this reissue specification; matter printed in italics indicates the additions made by reissue.

*Notice: More than one reissue application has been filed for the reissue of U.S. Pat. No. 7,381,649. The reissue applications are application Ser. Nos. 12/792,373 (the present application) and 13/372,622, which is a divisional reissue of U.S. Pat. No. 7,381,649.*

BACKGROUND

As the semiconductor industry has progressed into nanometer technology nodes in pursuit of higher device density, higher performance, and lower cost, challenges from both fabrication and design issues have resulted in the development of new three dimensional designs, such as the Fin-like field effect transistor (FinFET). However, the fabrication and design of such devices, including FinFET devices, raises issues such as compatibility with planar transistor fabrication, degradation of carrier mobility, and reliability.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
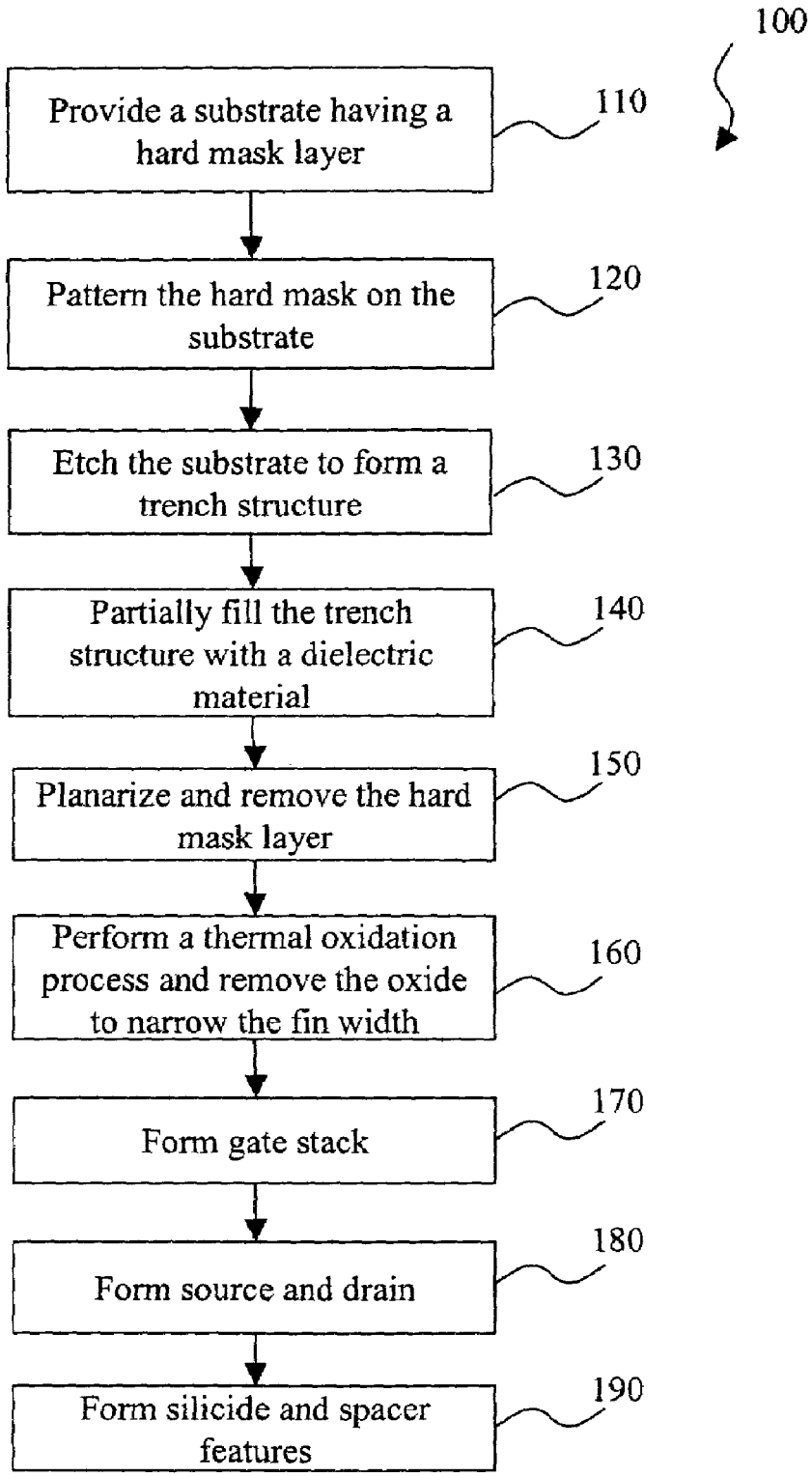
FIG. 1 is a simplified flowchart of one embodiment of a method for forming a multi-gate device.

The present disclosure relates generally to a microelectronic device and, more specifically, to a microelectronic device having a multiple-gate structure and a method for its fabrication.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, in one embodiment, a method 100 may be used to form a multiple-gate device, such as a FinFET. FIGS. 2-10 provide sectional views of one embodiment of a device fabricated using the method 100 and FIGS. 11-13 provide perspective views of the same device. Accordingly, embodiments of both a method for fabricating a device and the device itself are described below.

Figure 2:
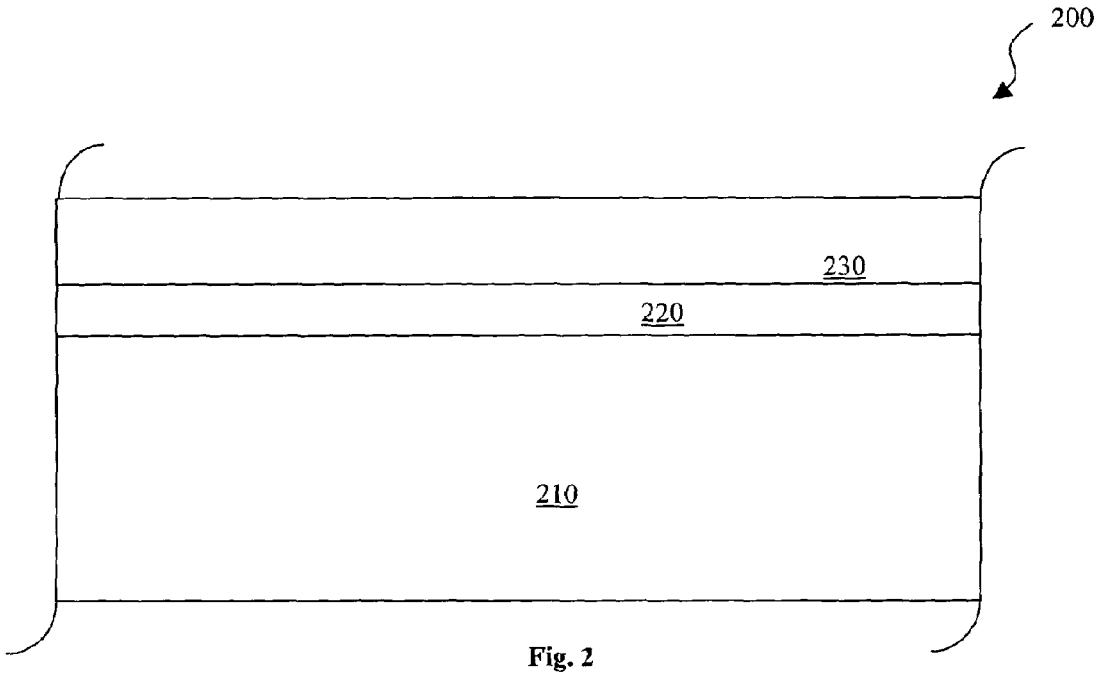
FIGS. 2-10 are sectional views of embodiments of a multi-gate device during fabrication using the method of FIG. 1.

Referring to FIG. 1 and with additional reference to FIG. 2, the method 100 begins in step 110 by providing a substrate 210 with a hard mask layer 230. The substrate 210 may comprise an elementary semiconductor such as silicon, germanium, and diamond, or a compound semiconductor such as silicon carbide, gallium arsenic, indium arsenide, and indium phosphide. The substrate 210 may comprise an alloy semiconductor such as silicon germanium, silicon germanium carbide, gallium arsenic phosphide, and gallium indium phosphide. The semiconductor substrate 210 may have a single-crystal structure and the substrate surface may have a proper orientation. For example, silicon substrate may have a top surface oriented in (100), (110), or (111). The substrate 210 may include an epitaxial layer. For example, the substrate may have an epitaxial layer overlying a bulk semiconductor. Further, the substrate may be strained for performance enhancement. For example, the epitaxial layer may comprise a semiconductor material different from those of the bulk semiconductor such as a layer of silicon germanium overlying a bulk silicon, or a layer of silicon overlying a bulk silicon germanium formed by a process including selective epitaxial growth (SEG). Furthermore, the substrate 210 may comprise a semiconductor-on-insulator (SOI) structure. For examples, the substrate may include a buried oxide (BOX) layer formed by a process such as separation by implanted oxygen (SIMOX). The substrate 210 may comprise a p-type doped region and/or an n-type doped region. All doping may be implemented by a process such as ion implantation.

The substrate 210 may comprise an isolation feature to separate different devices formed on the substrate. The isolation feature may comprise different structure and can be formed using different processing technologies. For example, the isolation feature may comprise a dielectric isolation such as local oxidation of silicon (LOCOS), shallow trench isolation (STI), junction isolation, field isolation, and/or other suitable isolation structures.

The hard mask layer 230 may include silicon nitride, silicon oxynitride, silicon carbide, and/or other suitable dielectric materials and may be formed using a method such as chemical vapor deposition (CVD), physical vapor deposition (PVD), or atomic layer deposition (ALD). The semiconductor device 200 may further include a pad layer 220 positioned between the hard mask layer 230 and the substrate 210, as shown in FIG. 2. The pad layer 220 may comprise silicon oxide and/or other suitable materials, and may be formed by a method such as thermal oxidation.

Figure 3:
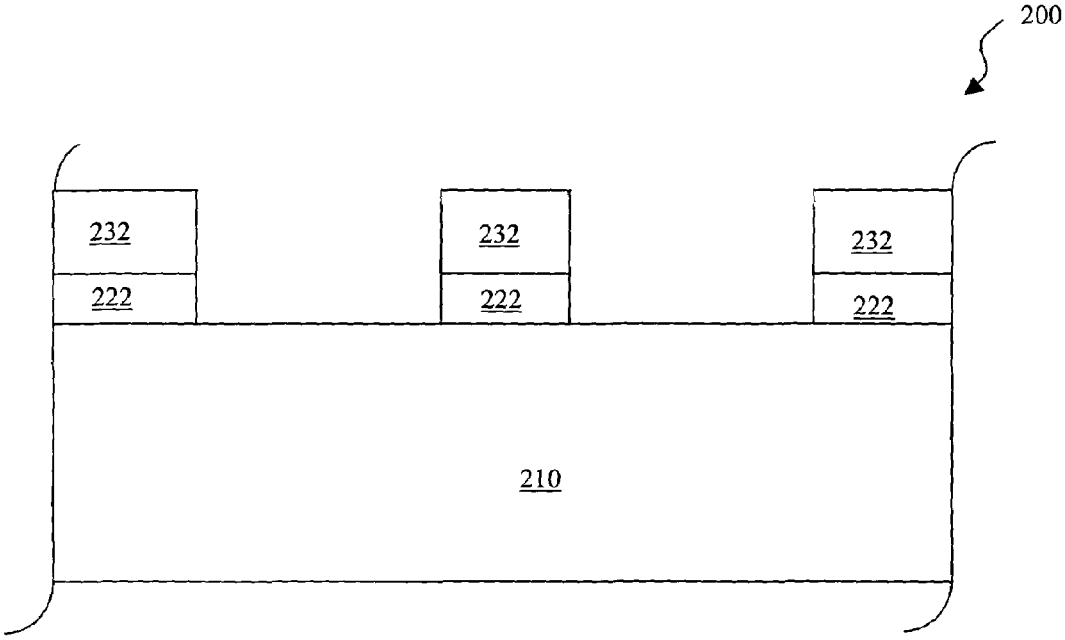

In step 120 and with additional reference to FIG. 3, the hard mask layer 230 and the pad layer 220 are patterned to form a plurality of pad islands 222 and hard mask islands 232. The patterning may be accomplished using a suitable process such as photolithography and etching. The etching processing is implemented to transfer the pattern defined by a photomask to the pad layer 220 and hard mask layer 230. The photolithography processing may include photoresist coating, photoresist patterning, and photoresist stripping. The photoresist patterning may further include processing steps of soft baking, mask aligning, exposing, post-exposure baking, developing photoresist, and hard baking. The photolithography processing may be implemented or replaced by other proper methods such as maskless photolithography, electron-beam writing, ion-beam writing, optical writing, and molecular imprint. The etching processing may include wet etch, dry etch, ion-reactive-etch (RIE), and other suitable processing. For example, the hard mask layer 230 of silicon nitride may be removed by phosphoric acid while the pad layer 220 of silicon oxide may be removed by hydrofluoric (HF) acid or buffered hydrofluoric (BHF) acid. A cleaning process may be followed after the patterning of the hard mask layer 220 and the pad layer 230.

Figure 4:
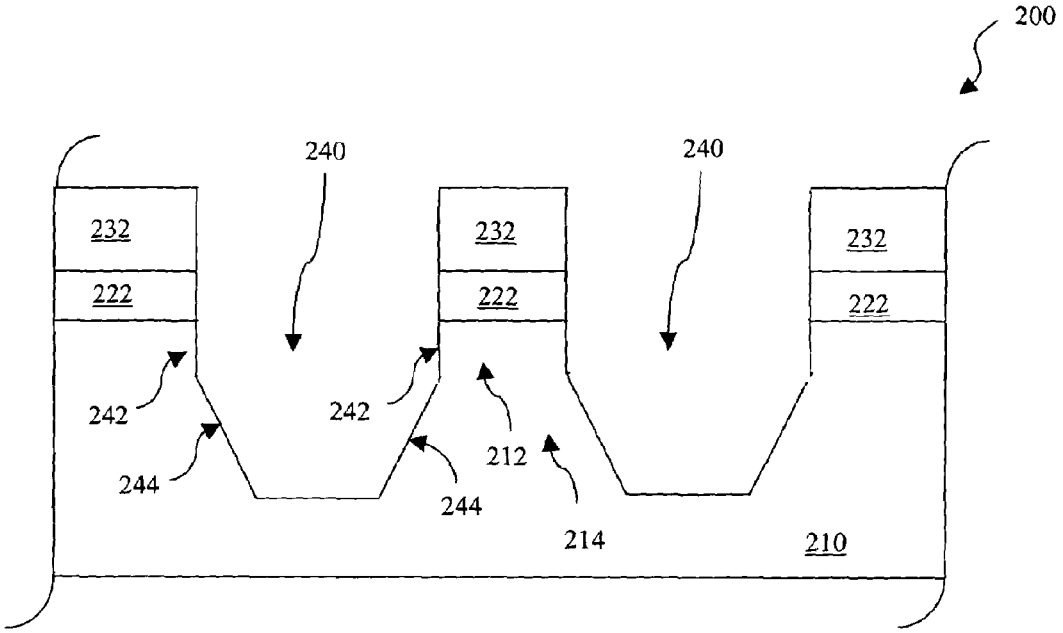
Figure 5:
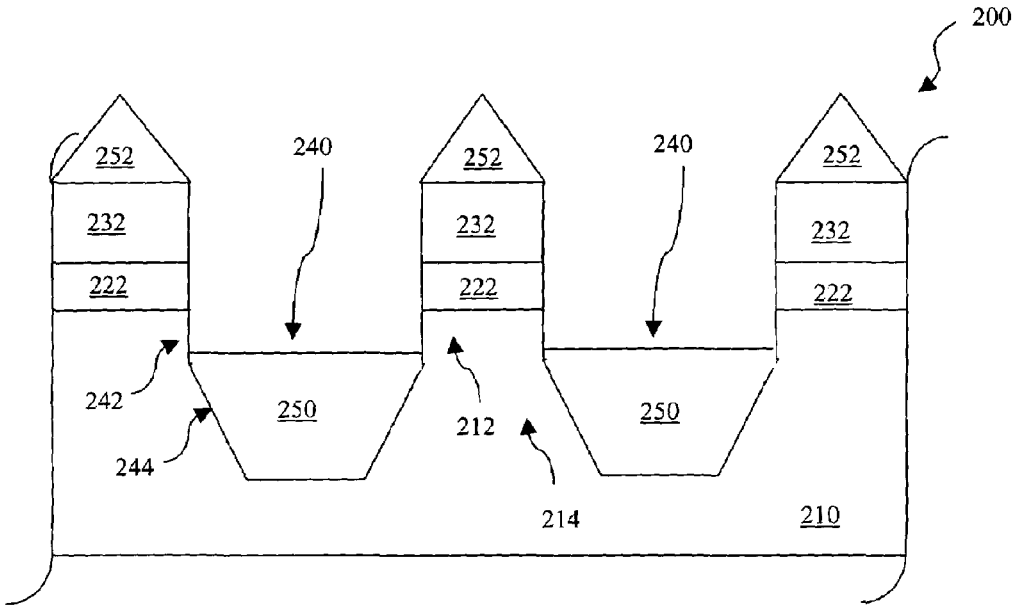
Figure 6:
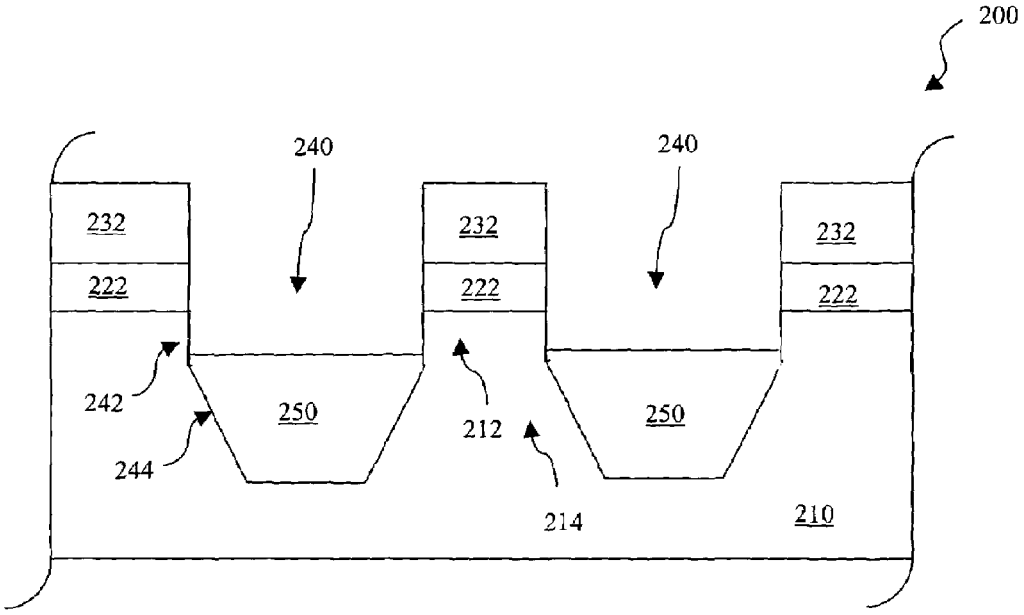
Figure 7:
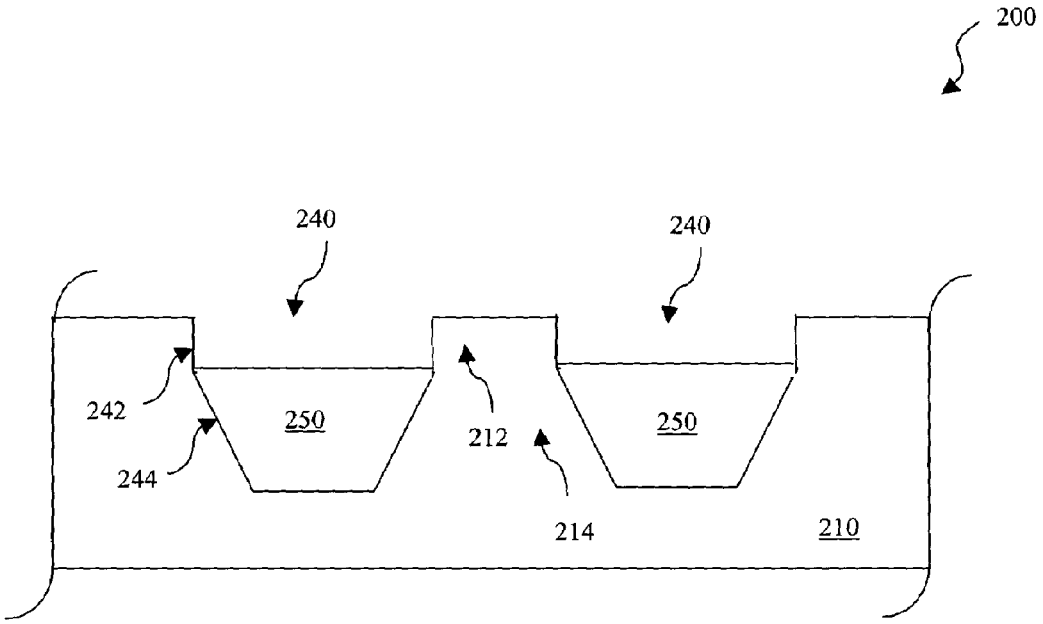

Referring to FIGS. 1 and 4, the method 100 proceeds to step 130 in which the substrate 210 is etched to form a plurality of shallow trenches 240 and a plurality of semiconductor mesas. Each of the plurality of semiconductor mesas may comprise a top semiconductor mesa 212 and a bottom semiconductor mesa 214. The top semiconductor mesa 212 has a sidewall 242 of a first slope. The bottom semiconductor mesa 214 has a sidewall 244 of a second slope. For example, the sidewall 242 may be substantially vertical and the first slop may be about 90 degrees. In another example, the first slope may range from about 85 degrees to about 90 degrees. The second slope may range from about 60 degrees to about 85 degrees. The bottom semiconductor mesa 214 may have a thickness ranging from about 200 nm to about 1000 nm. The top semiconductor mesa 212 may have a thickness ranging from about 10 nm to about 100 nm. The two trenches 240 define a first outline in the surface of the mesa 212 from one sidewall 242 to another sidewall 242. The first outline of the top semiconductor mesa 212 has a width ranging from about 5 nm to about 100 nm. In one embodiment, an exemplary top semiconductor mesa 212 may have a thickness of about 70 nm and a width of about 20 nm. A second outline of the top semiconductor mesa 212 may be defined from the source to drain and be substantially perpendicular to the first outline. The second outline of the top semiconductor mesa 212 may be substantially parallel to the channel direction of the semiconductor device 200. The sidewalls 242 are associated with the second outline of the top semiconductor mesa 212.

As mentioned before, the substrate 210 may have a single-crystal structure and the substrate surface may have a crystal orientation such as (100), (110), or (111). The substrate 210 may be positioned such that the sidewalls of the top semiconductor mesa 212 may have one pre-selected crystal orientation or at least two pre-selected crystal orientations. In one example, the substrate surface, along with the surface of the top semiconductor mesa 212, may have a crystal orientation (100). Furthermore, the sidewalls 242 of the top semiconductor mesa 212 and the sidewalls associated with the first outline may each have a crystal orientation (100). In another embodiment, the substrate surface, along with the surface of the top semiconductor mesa 212, may have a first crystal orientation. The sidewalls 242 of the top semiconductor mesa 212 may have a second crystal orientation. The sidewalls of the top semiconductor mesa 212 associated with the first outline may have a third crystal orientation.

The plurality of shallow trenches 240, the top semiconductor mesas 212, and the bottom semiconductor mesas 214 may be formed by a suitable process such as etching the substrate under the patterned hard mask layer. The etching process may be selective etching such that only the substrate may be removed while the patterned hard mask layer remains. For example, if the substrate 210 comprises silicon while the hard mask layer 230 comprises silicon nitride (and the pad layer 220 comprises silicon oxide), the etchant may have a higher etching rate to silicon oxide and relatively lower etching rate to the hard mask layer (and the pad layer). The openings of the hard mask layer are transferred to the semiconductor substrate to form the plurality of shallow trenches 240. A suitable etching process may include wet etching, dry etching, RIE, and/or combinations thereof. A suitable etching process may comprise various sub-steps to form two-slope shallow trenches 240 and the semiconductor mesas. For example, a dry etching process may be applied and followed by a wet etching process used to form a two-slope trench structure. As an example of a silicon substrate etch, the dry etching may include HBr, $Cl_2$, $SF_6$, $O_2$, Ar, and/or He; the wet etching may include HF—$HNO_3$—$H_2O$, and/or KOH.

Referring to FIGS. 1 and 5a, the method 100 proceeds to step 140, where the plurality of shallow trenches 240 are partially filled with a dielectric material. The dielectric material may be formed in the shallow trenches to form shallow trench isolation (STI) features 250 and over the semiconductor islands to form dielectric islands 252. The dielectric islands 252 may be formed in direct contact with the hard mask islands 232. In another example, the hard mask islands 232 and/or pad islands 222 may be removed and the dielectric islands 252 may be formed on the semiconductor mesas 212. The STI features 250 may substantially fill the bottom portions of the shallow trenches (as defined by sidewalls 244). The dielectric material may comprise silicon oxide, silicon nitride, silicon oxynitride, fluorinated silicate glass (FSG), low dielectric constant (K) materials, combinations thereof, and/or other suitable dielectric material. The STI features 250 may be formed by a process such as thermal oxidation, spin-on glass (SOG), CVD, and PVD. An exemplary method may use a high density plasma CVD (HDP-CVD) process to form silicon oxide. The STI features 250 may have a multiple-layer structure and may be formed in multiple steps.

Referring to FIGS. 1 and 6a, the method 100 proceeds to step 150 during which the plurality of the dielectric islands 252 are removed by a suitable process such as a chemical mechanical planarization (chemical mechanical polishing or CMP) process. The dielectric islands 252 are removed during this process while the dielectric material forming the STI features 250 remains substantially intact.

In another embodiment, a different STI structure may be fulfilled using a method described below in place of steps 140 and 150, with reference to FIGS. 5b and 6b. The plurality of shallow trenches 240a and 240b in FIG. 5b are substantially filled with a dielectric material to form a plurality of STI features. Then the device 200 may be covered by a photoresist layer using a method such as a photolithography process similar to the photolithography process described in step 120. The photoresist layer is patterned to cover a first group of the plurality of STI features in a first region, including 240a, and leave the second group thereof in a second region uncovered, including 240a. An etching method may be employed to etch the second group of STI features formed in the second region such that the second group of STI features (such as 240b) in the second regions are recessed to partially expose sidewalls of the shallow trenches in the second region. For example, the top semiconductor mesas in the second region have sidewalls substantially exposed, similar to the top semiconductor mesas 212 in FIG. 5a. And the STI features formed in the first region (such as 240b) are not etched and remain substantially filled. The etching process to recess the second group of STI features may comprises a proper etching process including a reactive ion etching (RIE) process as an example. Other proper etching process may be alternatively used to utilize the above structure.

Referring to FIG. 6b, the patterned photoresist layer may be removed by a suitable method such as wet stripping and plasma ashing. The plurality of the dielectric islands 252 may be removed by a suitable process such as a CMP process. The dielectric material forming the STI features 250 remains substantially intact while the dielectric islands 252 are removed. The hard mask layer and oxide pad layer may be removed as well during the process to remove the dielectric islands 252 or in separate processes. The semiconductor mesas in the second region have sidewalls partially exposed and may be used to form three dimensional structures such as FinFET transistors while the semiconductor mesas in the first regions may be used to form planar structures such as planar transistors. In one example, core devices may be formed with FinFET structures in the second region and peripheral devices may be formed with planar structures in the first region. The dielectric material may be similar to those described in step 140 such as silicon oxide, silicon nitride, silicon oxynitride, fluorinated silicate glass (FSG), low dielectric constant (K) materials, combinations thereof, and/or other suitable dielectric material as well. The STI features 250 may be formed by a process such as thermal oxidation, spin-on glass (SOG), CVD, and PVD. An exemplary method may use a high density plasma CVD (HDP-CVD) process to form silicon oxide. The STI features may have a multiple-layer structure and may be formed in multiple steps With reference to FIG. 7, the plurality of the hard mask islands 232 may be removed by a suitable process including etching and/or CMP. The pad islands 222 may also be removed during this step. For example, CMP processing may be used remove both the hard mask islands 232 and the pad islands 222 and may planarize the surface of the semiconductor device 200. In another example, the hard mask islands 232 may be removed by a CMP processing and the pad islands 222 may be then removed by etching such as wet etching. In another example, both the pad islands 222 and the hard mask islands 232 may be removed by a sequential etching process such as phosphoric acid to remove the hard mask islands 232 and HF to remove the pad islands 222. In still another example, the hard mask islands 232 may be removed by a process such as CMP and the pad islands 222 may remain substantially intact. In another example, as mentioned before, the hard mask islands 232 may be removed in an earlier step (e.g., between steps 130 and 140).

Figure 8:
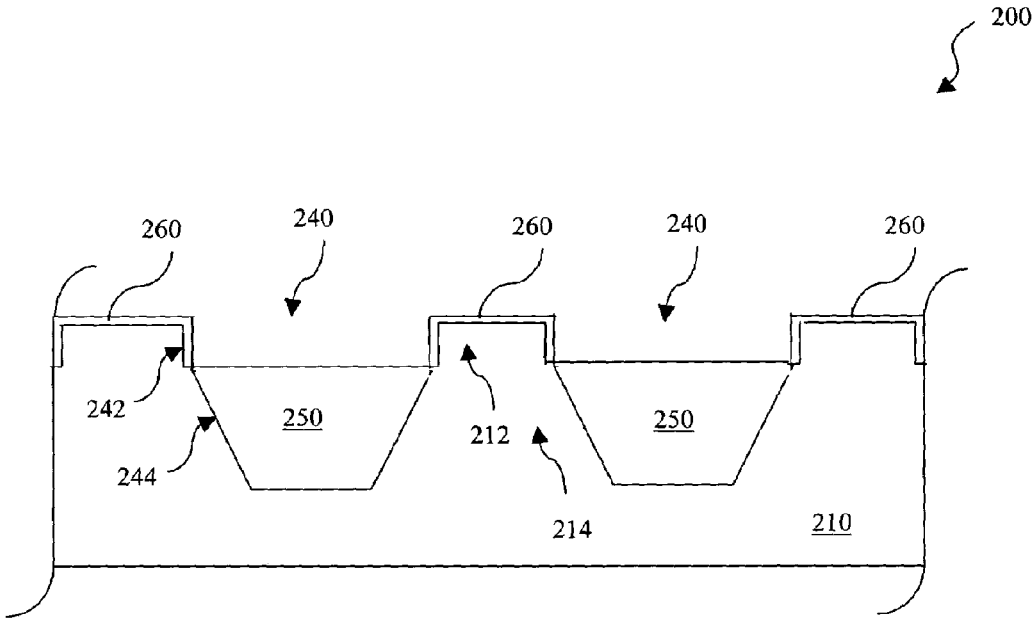
Figure 9:
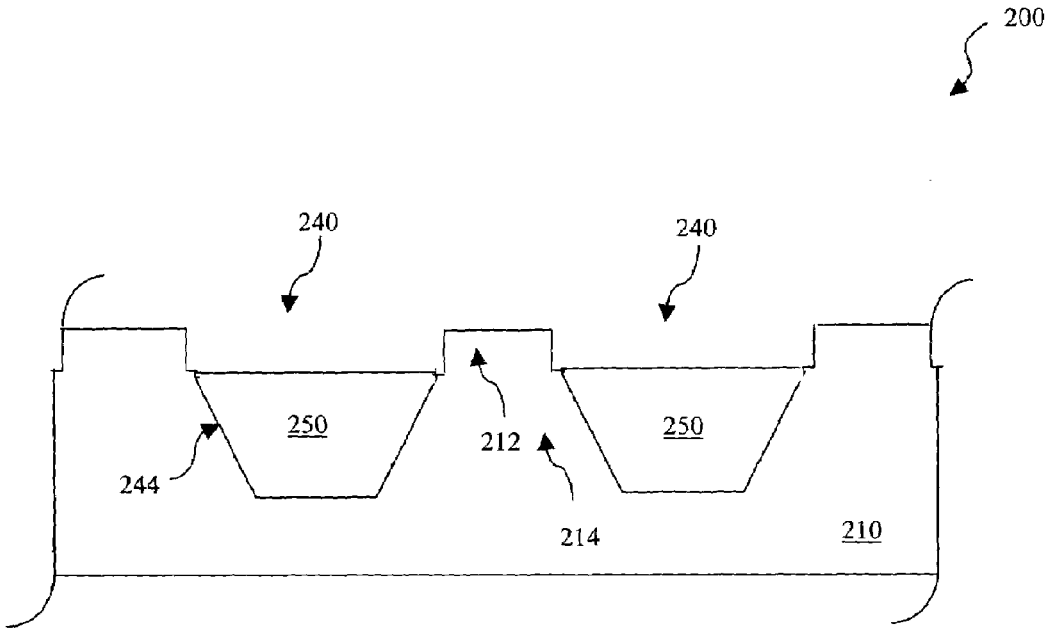

Referring to FIGS. 1, 8, and 9, the method 100 proceeds to step 160 in which the top semiconductor mesa 212 may be narrowed by a thermal oxidation process. The top semiconductor mesa 212, used to form active regions, may be narrowed after being formed by etching through the patterned hard mask at step 130. The semiconductor mesa 212 may undergo a thermal oxidation process using a high temperature in an oxygen environment to form an oxide layer 260, as shown in FIG. 8. The thermal oxidation process may comprise a dry oxidation process using an oxygen environment and/or a wet oxidation process. The temperature used in thermal oxidation of a silicon mesa may range from about 900° C. to about 1200° C. The oxide layer 260 is then removed by an etching process, as shown in FIG. 9. For example, an HF or BHF etching solution may be used to remove the silicon mesa, providing a smaller width of the top semiconductor mesa 212 than may be obtained using photolithography patterning techniques. Furthermore, the surface of the top semiconductor mesa 212 may be cleaned during the above thermal oxidizing and removal processing.

Figure 10:
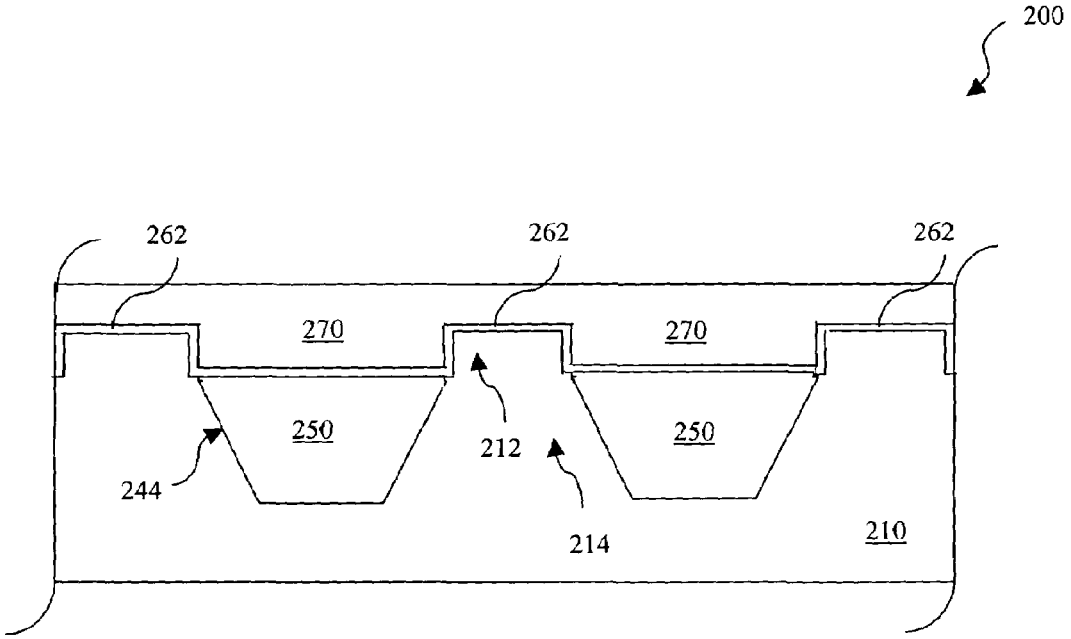
Figure 11:
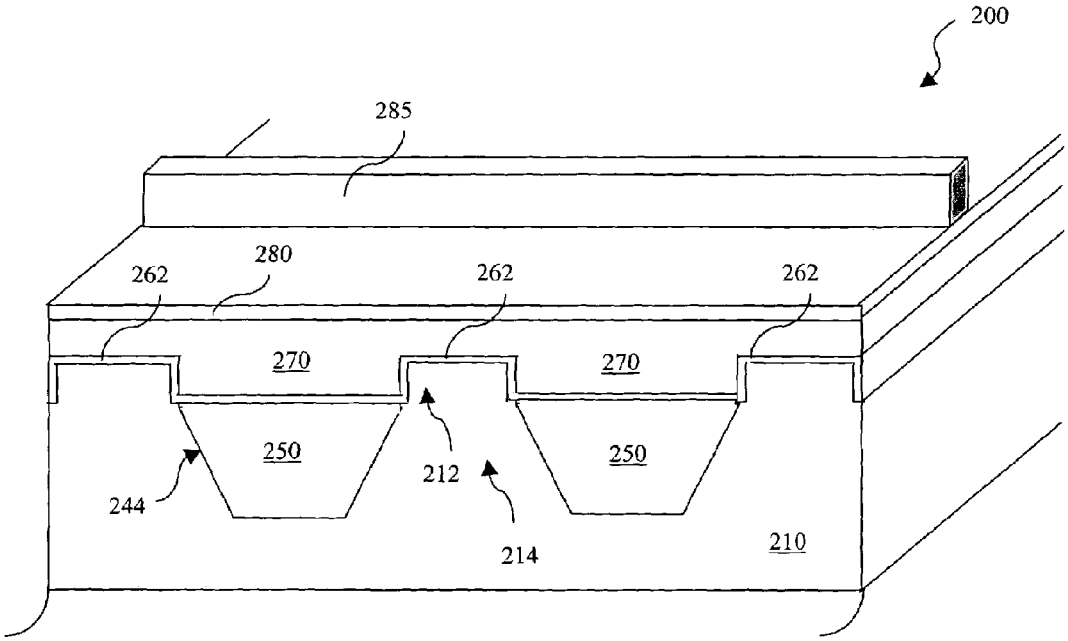
FIGS. 11-13 are perspective views of one embodiment of a multi-gate device during fabrication.
Figure 12:
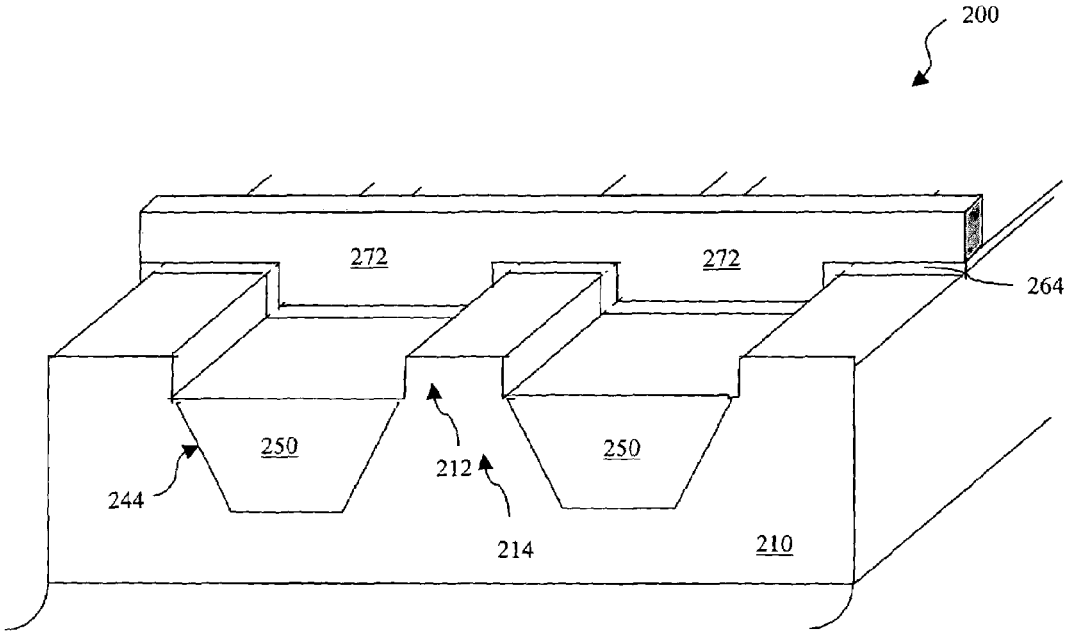
Figure 13:
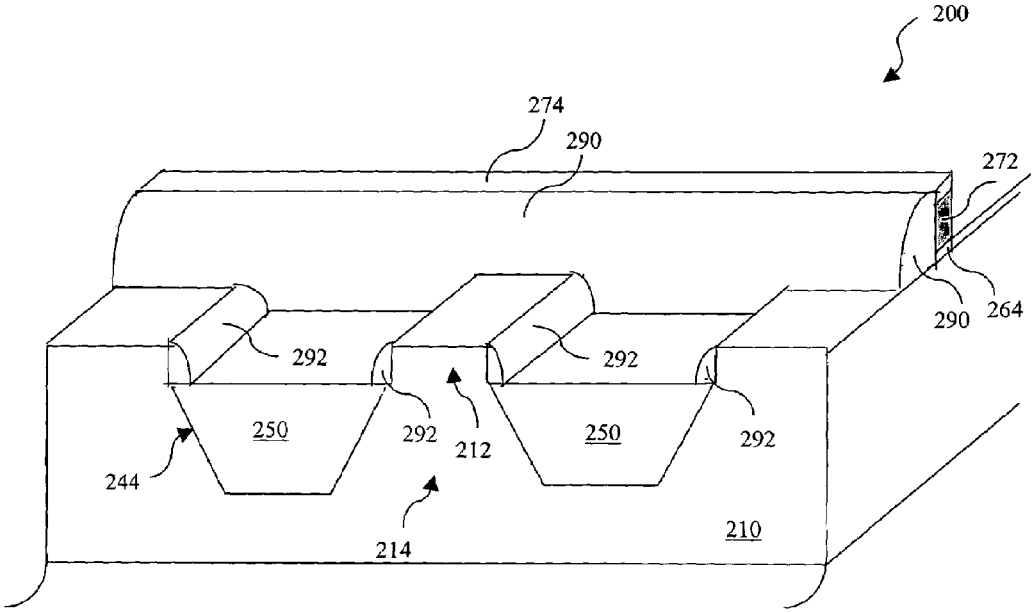

Referring to FIGS. 1 and 10-12, the method 100 proceeds to step 170 in which a multiple-gate stack may be formed around the top semiconductor mesa 212. A gate dielectric layer 262 may be formed around the top semiconductor mesa 212. As shown in FIG. 10, the gate dielectric layer 262 may be disposed on the top surface and sidewalls 242 of the top semiconductor mesa 212, and over the dielectric material 250. The gate dielectric layer 262 may comprise silicon oxide, silicon oxynitride, high dielectric-constant (K) material, or combinations thereof. The high-k material may include TaN, TiN, $Ta_2O_5$, $HfO_2$, $ZrO_2$, HfSiON, $HfSi_x$, $HfSi_xN_y$, $HfAlO_2$, $NiSi_x$, and/or other suitable materials. The gate dielectric layer 262 may have a thickness ranging between about 20 Angstroms and about 200 Angstroms. The gate dielectric layer may have a multilayer structure such as one layer of silicon oxide and one layer of high-k material. The dielectric layer may be formed using thermal oxidation, ALD, CVD, PVD, and/or other suitable methods.

A gate electrode layer 270 may be formed over the gate dielectric layer 262 to substantially fill the trenches 240 and may extend above the top semiconductor mesa 212, as shown in FIG. 10, such that the thickness thereof over the top surface of the top semiconductor mesa 212 may be more than a designed thickness of the gate electrode plus a processing margin. The gate electrode layer 270 may comprise polycrystalline silicon (poly-silicon), metal such as Al. Cu, W, Ti, Ta, TiN, TaN, NiSi, CoSi, and/or other proper conductive materials. The gate electrode layer 270 may be formed by CVD, PVD, plating, ALD, and other suitable processes. The gate electrode layer 270 may have a multilayer structure and may be formed in a multiple-step process.

The gate dielectric layer 262 and the gate electrode layer 270 are then patterned to form a plurality of gate stacks using a process similar to the patterning and etching processing described in steps 120 and 130. One exemplary method for patterning the gate dielectric and electrode layers is described below. Referring to FIG. 11, a hard mask layer 280 may be formed on the gate electrode layer 270. The hard mask layer 280 may be substantially similar to the hard mask layer 230 in formation and composition, but may use other suitable materials and processing methods if desired. For example, the hard mask layer 280 may comprise silicon oxynitride and may be formed by a CVD process. A layer of photoresist may be formed over the hard mask layer 280 by a suitable process such as spin-on coating and then patterned to form a patterned photoresist feature 285 by a proper patterning method similar to those used in step 120. Then the pattern of the photoresist 285 may then be transferred to the hard mask layer 280 and to the underlying gate electrode layer 270 and the gate dielectric layer 262 to form gate electrodes 272 and gate dielectric features 264, as shown in FIG. 12, in a plurality of processing steps and various sequences. The photoresist 285 may be stripped and the patterned hard mask may then be removed. In one embodiment, the hard mask layer 280 is etched through the patterned photoresist 285 by an etching process such as dry etching and then the photoresist 285 is stripped. The gate dielectric layer 262 and the gate electrode layer 270 are then etched through the patterned hard mask layer to form the gate dielectric features 264 and gate electrodes 272. The patterned hard mask layer 280 is removed afterward using a process such as wet etching. The gate dielectric feature 264 and the gate electrodes 272 may have multiple sides in direct contact with the top semiconductor mesa 212, including direct contact with the top surface and sidewalls to enhance the performance of the semiconductor device 200.

With reference to FIGS. 1 and 13, the method 100 may proceed to step 180 to form source and drain (S/D) regions and step 190 to form silicide features and spacers. Forming S/D regions and the silicide and spacers may be combined into a set of processes. The source and drain regions may be formed in the top semiconductor mesa and may have another width wider than the width defined by the first outline of the top semiconductor mesa 212. The source and drain may have a raised structure formed over the top semiconductor mesa 212, proximate to the gate dielectric 264 and the gate electrode 272. The source and drain regions may be disposed in and/or on the top semiconductor mesa 212 and laterally interposed by the gate stack.

In one example, the S/D regions may comprise a source drain extension (SDE, light doped drain, or LDD) structure and a heavy doped source and drain features. The S/D regions may comprise various doping profiles and may be formed by a plurality of ion implant processes. The first ion implantation process may have a lower doping concentration ranging from about $10^{13}$ to about $5\times10^{14}$ ion/cm$^2$. The dimension of the first ion implantation may be extended to and aligned with the sidewall of the gate electrode and gate dielectric. The second ion implantation process may have a higher doping concentration ranging from about $10^{15}$ to about $5\times10^{15}$ ion/cm$^2$. The dimension of the second ion implantation may be offset from the sidewall of the gate electrode by a gate spacer. The S/D regions may comprise a double diffused drain (DDD) structure that provides a high breakdown voltage where the heavy doped regions encompass the SDE regions. An additional doping profile may be implemented to form a halo structure proximate to the SDE ends having the same type dopant of the substrate and formed using a process such as an angled ion implantation process.

Silicide features 274 may be formed on the gate electrode 272 and may also be formed on the S/D regions (not shown). The silicide features may comprise nickel silicide, cobalt silicide, tungsten silicide, tantalum silicide, titanium silicide, platinum silicide, erbium silicide, palladium silicide, and/or combinations thereof. The metal silicide may be formed by CVD, PVD, or ALD. In another example, metal silicide may be formed by a silicidation processing, referred to as self-aligned silicide (salicide). The salicide processing may include metal deposition, annealing, and removal of unreacted metal processes. The silicide features may be formed after forming spacer features.

Spacer features may be formed on the semiconductor device 200. For example, spacer features 290 may be formed and disposed on the sidewalls of the gate electrode 272 and extended to the surfaces of the STI features 250 and the semiconductor mesa 212. The spacer features 290 may include a dielectric material such as silicon nitride (SiN), silicon oxynitride (SiON), and/or silicon oxide ($SiO_2$). The spacer features 290 may be formed by depositing the dielectric material using CVD, ALD, PVD, and/or other processing methods, and then anisotropically etching back using a method such as dry etching. The spacer features may have a multiple-layer structure such as one layer of silicon oxide and one layer silicon nitride. In one example, the SDE regions may be formed before the formation of the spacer features and the heavily doped S/D regions may be formed thereafter such that the heavy doped S/D regions are offset from the SDE region by the spacer features 290. Other spacer features may be formed, such as spacer features 292 formed on the sidewalls of the semiconductor mesa 212 and extended to the surfaces of the STI features 250.

The doped channel, source, and drain in the semiconductor device 200 may be formed by various doping processes such as ion implantation and may comprise P-type dopants and N-type dopants. The N-type dopants are employed to form a channel doping profile for a P-type metal-oxide- semiconductor field effect transistor (PMOSFET or PMOS) or source/drain doping profiles for an N-type metal-oxide-semiconductor field effect transistor (NMOSFET or NMOS). The N-type dopants may include phosphorus, arsenic, and/or other materials. P-type dopants are employed to form a channel doping profile for an NMOS or source/drain doping profiles for a PMOS. The P-type dopants may include boron, boron fluoride, indium, and/or other materials. Subsequent diffusion, annealing, and/or electrical activation processes may be employed after the impurity is implanted.

Furthermore, the S/D regions may comprise semiconductor materials different from those of the substrate. For example, the semiconductor mesa may comprise silicon while the source/drain may comprise silicon germanium. Alternatively, the semiconductor mesa may comprise silicon germanium while the source/drain may comprise silicon. The S/D regions may be in a single crystal structure formed by a process such as selective epitaxy growth (SEG), and other suitable methods.

Figure 14:
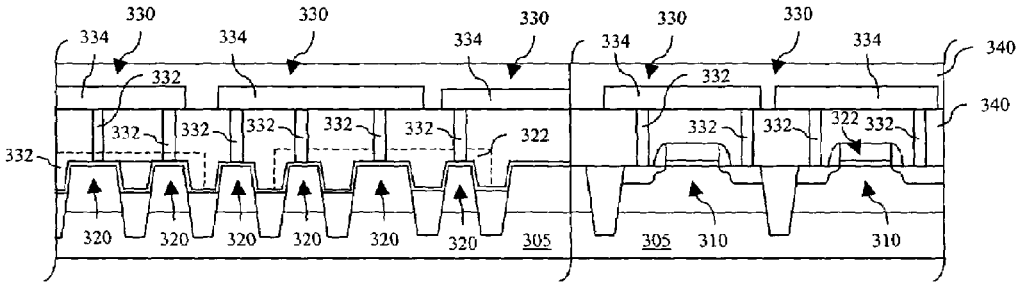
FIG. 14 is a sectional view of one embodiment of an integrated circuit having a plurality of multi-gate devices.

Referring to FIG. 14, illustrated is a sectional view of one embodiment of an integrated circuit 300 constructed according to aspects of the present disclosure. The integrated circuit 300 is one environment in which the semiconductor device 200 of FIG. 13 may be implemented. For example, the integrated circuit 300 includes a plurality of planar MOS devices 310 and a plurality of FinFET devices 320, wherein one or more of the plurality of devices 320 may be substantially similar to the semiconductor device 200 of FIG. 13.

The integrated circuit 300 also includes interconnects 330 extending through dielectric layers 340 to ones of the plurality of planar MOS devices 310 and the plurality of FinFET devices 320. The dielectric layers 340 may comprise silicon oxide, fluoride-doped silicate glass (FSG), low dielectric-constant (K) material, and/or other materials, and may be formed by CVD, PVD, spin-on coating, and/or other suitable methods. The dielectric layers 340 may each have a thickness ranging between about 100 nm and about 1000 nm, although the dielectric layers 340 are not limited by the scope of the present disclosure to particular thicknesses.

The interconnects 330 may comprise multilayer interconnects having contact features and via features 332 for vertical interconnections and metal lines 334 for horizontal interconnections. The contact/via features 332 and metal lines 334 may be employed to interconnect ones of the plurality of planar devices 310 and the plurality of FinFET devices 320, and/or to connect ones of the plurality of planar devices 310 and FinFET devices 320 to other devices integral to or discrete from the integrated circuit 300. The multilayer interconnects may comprise aluminum-based, tungsten-based, copper-based materials, or combinations thereof. For example, copper-based multilayer interconnect may comprise copper, copper alloy, titanium, titanium nitride, tantalum, tantalum nitride, tungsten, polysilicon, metal silicide, or combinations. The copper-based multilayer interconnect may be formed using a dual damascene process.

The integrated circuit 300 may further comprise shallow trench isolation (STI) features formed in the substrate interposed between the planar devices 310 and between the FinFET devices 320. The STI features formed between the planar devices 310 may have the plurality of trenches substantially filled to a first depth. The STI features formed between the FinFET devices 320 may each have a trench partially filled to a second depth, resulting a recess and a semiconductor mesa. The second depth is less than the first depth. The semiconductor mesa interposed between shallow trench recesses provides a fin-like feature to form a FinFET transistor. The semiconductor mesa may have a thickness ranging from about 10 nm to about 100 nm and a width ranging from about 5 nm to about 100 nm. Alternatively, the integrated circuit 300 may comprise shallow trench isolation features having multiple depths to accommodate various devices. For example, a peripheral circuit may comprise the planar devices 310 with the STI feature having the first depth while a core circuit may comprise the FinFET devices 320 with the STI feature having a second depth. Alternatively, the sidewall of the shallow trench may have a round corner. The shallow trench may have two portions of the sidewall, a top portion of the sidewall having a first slope and a bottom portion thereof having a second slope. For example, the top portion of the shallow trenches may be substantially vertical and the bottom portion may have an angle ranging from about 60 degrees to about 85 degrees.

The integrated circuit 300 includes a substrate 305. The substrate 305 may be substantially similar to the substrate 210 in composition and configuration. The substrate 305 may have a single-crystal structure and the substrate surface may have a proper crystal orientation including (100), (110), or (111). The substrate 305 may be further positioned such that the sidewalls of the semiconductor mesa may have one pre-selected crystal orientation, or at least two pre-selected crystal orientations. In one example, the substrate surface, along with the surface of the top semiconductor mesa 212, may have a crystal orientation (100). Furthermore, the sidewalls of the semiconductor mesa parallel with the channel from source to drain and the sidewalls perpendicular to the channel may each have a crystal orientation (100). In another embodiment, the substrate surface, along with the surface of the semiconductor mesa, may have a first crystal orientation. The sidewalls of the top semiconductor mesa parallel with the channel may have a second crystal orientation. The sidewalls perpendicular to the channel may have a third crystal orientation. The integrated circuit 300 may have an enhanced performance including carrier mobility through optimized crystal orientation and configuration.

The substrate 305 may comprise an elementary semiconductor such as silicon, germanium, and diamond. The substrate may also comprise a compound semiconductor such as silicon carbide, gallium arsenic, indium arsenide, and indium phosphide. The substrate may comprise an alloy semiconductor such as silicon germanium, silicon germanium carbide, gallium arsenic phosphide, and gallium indium phosphide. The substrate may include an epitaxial layer. For example, the substrate may have an epitaxial layer overlying a bulk semiconductor. Further, the substrate may be strained for performance enhancement. For example, the epitaxial layer may comprise a semiconductor material different from those of the bulk semiconductor such as a layer of silicon germanium overlying a bulk silicon, or a layer of silicon overlying a bulk silicon germanium formed by a process including SEG. Furthermore, the substrate may comprise a SOI structure. For examples, the substrate may include a buried oxide layer.

The planar devices 310 and the FinFET devices 320 may each comprise a source and a drain, a gate electrode, a gate dielectric, and silicide features. The gate dielectric may include silicon oxide, silicon oxynitride, a high k material, and/or combinations thereof. The gate dielectric may comprise silicate such as $HfSiO_4$, HfSiON, HfSiN, $ZrSiO_4$, ZrSiON, and ZrSiN. The gate dielectric may include metal oxide such as $Al_2O_3$, $ZrO_2$, $HFO_2$, $Y_2O_3$, $La_2O_3$, $TiO_2$, and $Ta_2O_5$. HY2fSiON, HFSiN, $ZrSiO_4$, ZrSiON, and ZrSiN. The gate dielectric may be formed by thermal oxide, ALD, CVD, PVD, and/or other suitable processing.

The planar devices 310 may comprise a gate electrode 312 and the FinFET devices may comprise a gate electrode 322 as illustrated in FIG. 12. The gate electrode may comprise polycrystalline silicon (poly-Si), poly-SiGe, metal such as Cu, W, Ti, Ru, Ta, and Hf; metal nitride such as TaSiN, TaN, TiN, WN, MoN, and HfN; metal oxide such as $RuO_2$ and $IrO_2$, combinations thereof; and/or other proper conductive material. The gate electrode may be formed by CVD, PVD, plating, ALD, and other suitable processes. The gate spacers may be formed and may comprise silicon nitride, silicon oxide, silicon carbide, silicon oxynitride, or combinations thereof. The gate spacers may have a multilayer structure and may be formed by depositing a dielectric material and then anisotropically etching the material back.

A contact layer such as a silicide may be formed for reduced contact resistance and improved performance. The contact layer may comprise a metal silicide such as nickel silicide, cobalt silicide, tungsten silicide, tantalum silicide, titanium silicide, platinum silicide, erbium silicide, palladium silicide, or combinations thereof. In one example, silicide may be formed by a silicidation processing, referred to as self-aligned silicide (salicide).

The integrated circuit 300 may further comprise a contact etch stop layer (CESL or ESL) disposed over the planar devices 310 and the FinFET devices 320. The contact etch stop layers may comprise a material having a high resistance to contact etching processing, and so may protect the underlying silicide during the contact etch processing. The material of the contact etch stop layers may be selected based on an insulator material to be etched during the contact etch processing and an etchant to be used. For example, the contact etch stop layer may comprise silicon nitride, silicon oxynitride, silicon carbide, silicon oxide, and/or combinations thereof. In some embodiments, the contact etch stop layer may have a pre-designed stress such as a stress ranging from about 200 Mpa to about 2 Gpa. The contact etch stop layer may have a localized stress pattern. For example, the contact etch stop layer may have a tensile stress in one region such as an N-type MOS region and a compressive stress in another region such as a P-type MOS region. The stress of the contact etch stop layer may be tuned using parameters including processing temperature, composition, and impurities.

The integrated circuit 300 may comprise a variety of electric devices. These electric devices may include, but are not limited to, passive components such as resistors, capacitors, and inductors, active components such as metal-oxide-semiconductor field effect transistors (MOSFETs), bipolar transistors, high voltage transistors, high frequency transistors, memory cells, or combinations thereof. These electric devices comprises multiple-gate MOSFETs such as FinFETs and may further comprise planar MOSFETs, as illustrated in FIG. 14 and described above.

Thus the present disclosure provides a method for forming a semiconductor device. The method comprises forming a hard mask layer on a semiconductor substrate; patterning the hard mask layer to form a plurality of openings; etching the substrate through the plurality of openings of the hard mask layer to form a plurality of trenches separating a plurality of semiconductor mesas; partially filling the plurality of trenches with a dielectric material; removing the hard mask layer; and forming a plurality of multiple-gate features, each multiple-gate feature being in contact with a top surface and sidewalls of at least one of the plurality of semiconductor mesas.

The method may further comprise performing a thermal oxidizing process on the plurality of semiconductor mesas to form a semiconductor oxide layer; and removing the semiconductor oxide layer to narrow the plurality of semiconductor mesas before forming the plurality of multiple-gate features on the substrate. Each of the plurality of semiconductor mesas may be formed to have a top portion having sidewalls of a first slope and a bottom portion having sidewalls of a second slope, and wherein each of the plurality of trenches is formed to have a top trench portion having a sidewall of the first slope and a bottom trench portion having a sidewall of the second slope. The first slope may range from about 90 degrees to about 85 degrees. The second slope may range from about 60 degrees to about 85 degrees. The partially filling the plurality of trenches may comprise substantially filling the plurality of bottom trench portions. Alternatively, the partially filling the plurality of trenches may comprise substantially filling the plurality of both top and bottom trench portions to form a first group of shallow trench isolation (STI) features and a second group of STI features; forming a photoresist layer patterned to cover the first group of STI features; and recessing the second group of STI features such that the second group of STI features are substantially within the bottom trench portions. The recessing may comprise a reactive ion etching (RIE) process. The partially filling the plurality of trenches may comprise utilizing a high density plasma chemical vapor deposition (HDP-CVD) process. The dielectric material may comprise a material selected from the group consisting of silicon oxide, silicon nitride, silicon oxynitride, fluorinated silicate glass (FSG), low dielectric constant (K) materials, and combinations thereof. The etching the substrate through the plurality of openings of the hard mask layer may comprise using multiple processes. The multiple processes may comprise a method selected from the group consisting of dry etching, wet etching, and RIE. The forming a hard mask layer may comprise forming a silicon oxynitride layer. The method may further comprise forming a pad layer on the substrate before forming the hard mask layer. The pad layer may comprise silicon oxide formed by a thermal oxidation process.

Thus the present disclosure provides a method for forming a semiconductor device. The method comprises forming a hard mask layer on a semiconductor substrate; patterning the hard mask layer to form a plurality of openings; etching the substrate through the plurality of openings to form a plurality of trenches separating semiconductor mesas, wherein the semiconductor trenches are each defined by a top trench portion having a sidewall of a first slope and a bottom trench portion having a sidewall of a second slope; substantially filling the plurality of trenches to form shallow trench isolation (STI) features; forming a photoresist layer patterned to cover a first group of STI features in a first region and leave a second group of STI features in a second region uncovered; recessing the second group of STI features such that the second group of STI features are substantially within the bottom trench portions; removing the patterned hard mask layer; and forming a plurality of multiple-gate features on the substrate. The recessing may utilize a reactive ion etching process. The method may further comprise performing a thermal oxidizing process on the plurality of top semiconductor mesas in the second region to form a semiconductor oxide layer; and removing the semiconductor oxide layer.

The present disclosure provides a method for forming a semiconductor device. The device comprises patterning a substrate to form a plurality of trenches; partially filling the plurality of trenches with a dielectric material, resulting in a plurality of semiconductor mesas interposed by at least one of the plurality of trenches; and forming a plurality of gate electrodes on the substrate, each being in contact with a top surface and sidewalls of at least one of the plurality of semiconductor mesas. The patterning a substrate may comprise forming a hard mask layer on the substrate; patterning the hard mask layer to form a plurality of openings; and etching the substrate through the plurality of openings of the hard mask layer to form the plurality of trenches, wherein each trench has a top portion sidewall of a first slope and a bottom portion sidewall of a second slope.

The present disclosure also provides a semiconductor device. The semiconductor device comprises a first region in a substrate having a plurality of FinFET transistors interposed by a plurality of first shallow trench isolation (STI) features having a first depth; and a second region in the substrate having a plurality of planar transistors interposed by a plurality of second STI features having a second depth, wherein the second depth is greater than the first depth.

The plurality of FinFET transistors each may comprise a semiconductor mesa having multiple surfaces in contact with a gate dielectric. The multiple surfaces may have a pre-selected crystal orientation. The pre-selected crystal orientation may comprise a crystal orientation (100). The semiconductor mesa may have at least two pre-selected crystal orientations. The at least two pre-selected crystal orientations may be selected from the group consisting of crystal orientations (100), (110), and (111). The semiconductor mesa may have a thickness ranging from about 10 nm to about 100 nm. The semiconductor mesa may have a width ranging from about 5 nm to about 100 nm. The first STI features each may comprise a recess. The recess of at least one of the plurality of first STI features may comprise a sidewall with a rounded corner. The semiconductor device may further comprise a dielectric layer disposed over the plurality of FinFET transistors in the first region and the plurality of planar transistors in the second region. The dielectric layer may comprise a contact etch stop layer. The dielectric layer may have a thickness ranging from about 20 nm to about 200 nm. The dielectric layer may have a stress ranging from about 200 MPa to about 2000 MPa. The dielectric layer may comprise a plurality of tensile stress areas and a plurality of compressive stress areas. The plurality of tensile stress areas each may comprise an N-type FinFET transistor or an N-type planar transistor, and the plurality of compressive stress areas each may comprise a P-type FinFET transistor or a P-type planar transistor MOS transistor. The dielectric layer may be disposed on the multiple surfaces of the semiconductor mesa. The plurality of FinFET transistors and the plurality of planar transistors each may have a source feature and a drain feature formed on the substrate. The source and drain features may comprise a raised structure. The plurality of FinFET transistors and the plurality of planar transistors each may include silicide features disposed on the gate electrode and the source and drain features.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A method for forming a semiconductor device, comprising:

forming a hard mask layer on a semiconductor substrate;

patterning the hard mask layer to form a plurality of openings;

etching the substrate through the plurality of openings of the hard mask layer to form a plurality of trenches separating a plurality of semiconductor mesas, wherein each of the plurality of semiconductor mesas is formed to have a top portion having sidewalls of a first slope and a bottom portion having sidewalls of a second slope, and wherein each of the plurality of trenches is formed to have a top trench portion having a sidewall of the first slope and a bottom trench portion having a sidewall of the second slope, and wherein the first slope is different from the second slope;

partially filling the plurality of trenches with a dielectric material;

removing the hard mask layer;

*performing a thermal oxidizing process on the plurality of semiconductor mesas to form a semiconductor oxide layer; and*

*removing the semiconductor oxide layer to narrow the plurality of semiconductor mesas before forming the plurality of multiple-gate features on the substrate;* and forming a plurality of multiple-gate features, each multiple-gate feature being in contact with a top surface and sidewalls of at least one of the plurality of semiconductor mesas.

[2. The method of claim 1 further comprising:

performing a thermal oxidizing process on the plurality of semiconductor mesas to form a semiconductor oxide layer; and removing the semiconductor oxide layer to narrow the plurality of semiconductor mesas before forming the plurality of multiple-gate features on the substrate.]

3. The method of claim 1 wherein the first slope ranges from about 90 degrees to about 85 degrees.

4. The method of claim 1 wherein the second slope ranges from about 60 degrees to about 85 degrees.

5. The method of claim 1 wherein the partially filling the plurality of trenches comprises substantially filling the plurality of bottom trench portions.

6. The method of claim 1 wherein the partially filling the plurality of trenches comprises:

substantially filling the plurality of both top and bottom trench portions to form a first group of shallow trench isolation (STI) features and a second group of STI features;

forming a photoresist layer patterned to cover the first group of STI features; and recessing the second group of STI features such that the second group of STI features are substantially within the bottom trench portions.

7. The method of claim 6 wherein the recessing comprises a reactive ion etching (RIE) process.

8. The method of claim 1 wherein the partially filling the plurality of trenches comprises utilizing a high density plasma chemical vapor deposition (HDP-CVD) process.

9. The method of claim 1 wherein the dielectric material comprises a material selected from the group consisting of silicon oxide, silicon nitride, silicon oxynitride, fluorinated silicate glass (FSG), low dielectric constant (K) materials, and combinations thereof.

10. The method of claim 1 wherein the etching the substrate through the plurality of openings of the hard mask layer comprises using multiple processes.

11. The method of claim 10 wherein the multiple processes comprise a method selected from the group consisting of dry etching, wet etching, and RIE.

12. The method of claim 1 wherein the forming a hard mask layer comprises forming a silicon oxynitride layer.

13. The method of claim 1 further comprising forming a pad layer on the substrate before forming the hard mask layer.

14. The method of claim 13 wherein the pad layer comprises silicon oxide formed by a thermal oxidation process.

15. A method for forming a semiconductor device, comprising:

forming a hard mask layer on a semiconductor substrate;

patterning the hard mask layer to form a plurality of openings;

etching the substrate through the plurality of openings to form a plurality of trenches separating a plurality of semiconductor mesas, wherein the plurality of semiconductor trenches are each defined by a top trench portion having a sidewall of a first slope and a bottom trench portion having a sidewall of a second slope, and each of the plurality of semiconductor mesas have a top portion having sidewalls of a first slope and a bottom portion having sidewalls of a second slope, and wherein the first slope is different from the second slope;

substantially filling the plurality of trenches to form first shallow trench isolation (STI) features in a first region and second STI features in a second region;

forming a photoresist layer patterned to cover the first STI features in the first region and leave a second STI features in the second region uncovered;

recessing the second STI features such that the second STI features are substantially within the bottom trench portions;

removing the patterned hard mask layer; and forming a plurality of multiple-gate features on the substrate.

16. The method of claim 15 wherein the recessing utilizes a reactive ion etching process.

17. The method of claim 15 further comprising:

performing a thermal oxidizing process on the plurality of top semiconductor mesas in the second region to form a semiconductor oxide layer; and removing the semiconductor oxide layer.

18. A method for forming a semiconductor device, comprising:

patterning a substrate to form a plurality of trenches, *the patterning resulting in a plurality of semiconductor mesas interposed by at least one of the plurality of trenches, wherein each of the plurality of semiconductor mesas is formed to have a top portion having sidewalls of a first slope and a bottom portion having sidewalls of a second slope, wherein each of the plurality of trenches has a top portion sidewall of a first slope and a bottom portion sidewall of a second slope, and wherein the first slope is different from the second slope*;

*after the plurality of trenches have been formed to have the top portion having sidewalls of the first slope and the bottom portion having sidewalls of the second slope,* partially filling the plurality of trenches with a [dielectric material, resulting in a plurality of semiconductor mesas interposed by at least one of the plurality of trenches, wherein each of the plurality of semiconductor mesas is formed to have a top portion having sidewalls of a first slope and a bottom portion having sidewalls of a second slope, wherein each of the plurality of trenches has a top portion sidewall of a first slope and a bottom portion sidewall of a second slope, and wherein the first slope is different from the second slope; and] *dielectric;*

*forming a dielectric layer over adjacent ones of the plurality of semiconductor mesas and an upper surface of the dielectric in a trench interposed between the adjacent ones of the plurality of semiconductor mesas; and* forming a plurality of gate electrodes on the substrate, each being in contact with *the dielectric layer over* a top surface and sidewalls of at least one of the plurality of semiconductor mesas.

19. The method of claim 18 wherein the patterning a substrate comprises:

forming a hard mask layer on the substrate;

patterning the hard mask layer to form a plurality of openings; and etching the substrate through the plurality of openings of the hard mask layer to form the plurality of trenches.

* * * * *